United States Patent
Ioku et al.

(10) Patent No.: US 7,393,618 B2
(45) Date of Patent: Jul. 1, 2008

(54) COMPOSITION FOR COLOR CONVERTING MEMBER AND PRODUCTION METHOD OF COLOR CONVERSION SUBSTRATE USING THE SAME

(75) Inventors: Atau Ioku, Sodegaura (JP); Satoshi Hachiya, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 11/612,745

(22) Filed: Dec. 19, 2006

(65) Prior Publication Data

US 2008/0070153 A1 Mar. 20, 2008

(30) Foreign Application Priority Data

Sep. 15, 2006 (JP) ............................. 2006-250592

(51) Int. Cl.
*H05B 33/12* (2006.01)

(52) U.S. Cl. ........................ 430/7; 430/321; 252/584; 252/301.36; 427/162; 427/372.2

(58) Field of Classification Search ............. None
See application file for complete search history.

(56) References Cited

U.S. PATENT DOCUMENTS 4,309,481 A * 1/1982 Wakatsuki et al. .......... 428/403
5,213,894 A * 5/1993 Kim ........................... 428/403
2003/0222577 A1* 12/2003 Lu ............................. 313/504

FOREIGN PATENT DOCUMENTS

| JP | 3-152897 | | 6/1991 |
|---|---|---|---|
| JP | 9-115668 | | 5/1997 |
| JP | 2002-151262 | | 5/2002 |
| JP | 2003-229261 | | 8/2003 |
| JP | 2004-303592 | | 10/2004 |
| JP | 2005-522005 | | 7/2005 |
| JP | 2006-107761 | | 4/2006 |
| JP | 2006-154354 | | 6/2006 |
| JP | 2002-184576 A | * | 6/2007 |
| WO | WO 2006/022123 A1 | | 3/2006 |

* cited by examiner

*Primary Examiner*—John A. McPherson
(74) *Attorney, Agent, or Firm*—Oblon, Spivak, McClelland, Maier & Neustadt, P.C.

(57) ABSTRACT

A color conversion member composition (10) including (A) a color filter material (1), (B) a photoluminescent inorganic nanocrystal (3), (C) a medium (5), and (D) two or more solvents (5), wherein all of the solvents (D) are good solvents for one of the color filter material (A) (1) and the photoluminescent inorganic nanocrystal (B) (3), the solvents (D) include a good solvent and a poor solvent for the other of the color filter material (A) (1) and the photoluminescent inorganic nanocrystal (B) (3), and the good solvent has a vapor pressure higher than that of the poor solvent.

19 Claims, 4 Drawing Sheets

LIGHT SOURCE

COMPOSITION FOR COLOR CONVERTING MEMBER AND PRODUCTION METHOD OF COLOR CONVERSION SUBSTRATE USING THE SAME

TECHNICAL FIELD

The invention relates to a color conversion member used for various emitting devices including an organic electroluminescent (EL) device. In particular, the invention relates to a composition capable of more conveniently producing a color conversion layer and a contrast improving layer, and a method of producing a color conversion substrate using the composition.

BACKGROUND

Patent document 1 discloses technology in which the color of light from an emitting device is converted using a color conversion film and the resulting light is outcoupled to the outside. In this color changing medium (CCM) system, a method is known in the art which disposes a color filter (CF) in order to prevent a decrease in contrast which occurs when the color conversion film is excited and emits light due to external light, or to improve the chromatic purity of the color of light from the color conversion film (e.g. patent document 2).

However, since the color filter layer and the color conversion layer are formed in separate steps, production takes time, whereby cost is increased.

Patent document 3 discloses a method of reducing production cost by decreasing the amount of fluorescence conversion material used. However, the effects are insufficient.

Patent document 4 attempts to reduce cost by simplifying the production steps. However, since the color filter layer and the color conversion layer are formed in separate steps, the effects are not necessarily sufficient.

Patent document 5 discloses a method which includes applying a composition containing a color filter material and an organic fluorescent dye at one time, applying a transparent medium to the applied composition, and diffusing only the organic fluorescent dye into the transparent medium by heating. In the patent document 5, the organic fluorescent dye is diffused by heating. However, the organic fluorescent dye exhibits insufficient durability against irradiation of light. A photoluminescent inorganic nanocrystal exhibiting excellent light resistance may be incorporated into the composition instead of the organic fluorescent dye. However, since the photoluminescent inorganic nanocrystal cannot be diffused by heating, this measure cannot be applied to the above method.

[Patent document 1] JP-A-3-152897

[Patent document 2] JP-A-9-115668

[Patent document 3] JP-A-2003-229261

[Patent document 4] JP-A-2006-107761

[Patent document 5] JP-A-2002-151262

An object of the invention is to provide a composition capable of easily and efficiently producing a color conversion member including a color filter layer and a color conversion layer which contains a photoluminescent inorganic nanocrystal at a concentration which ensures a sufficient color conversion performance.

Another object of the invention is to provide a method capable of producing a color conversion substrate with high productivity.

SUMMARY OF THE INVENTION

According to the invention, the following color conversion member compositions, methods of producing a color conversion substrate using the same, and the like are provided.

1. A color conversion member composition comprising (A) a color filter material, (B) a photoluminescent inorganic nanocrystal, (C) a medium, and (D) a solvent, the color filter material (A) and the photoluminescent inorganic nanocrystal (B) differing in affinity to the medium (C) and/or the solvent (D).
2. A color conversion member composition comprising (A) a color filter material, (B) a photoluminescent inorganic nanocrystal, (C) a medium, and (D) two or more solvents, all of the solvents (D) being good solvents for one of the color filter material (A) and the photoluminescent inorganic nanocrystal (B), the solvents (D) including a good solvent and a poor solvent for the other of the color filter material (A) and the photoluminescent inorganic nanocrystal (B), and the good solvent having a vapor pressure higher than that of the poor solvent.
3. The color conversion member composition according to 2, wherein the relative volatility of the good solvent with respect to the poor solvent (vapor pressure of good solvent/vapor pressure of poor solvent) is 10 to 1000.
4. The color conversion member composition according to any one of 1 to 3, which contains the color filter material (A) in an amount of 1 to 10 wt %, the photoluminescent inorganic nanocrystal (B) in an amount of 1 to 10 wt %, the medium (C) in an amount of 10 to 50 wt %, and the solvent (D) in an amount of 30 to 80 wt %.
5. The color conversion member composition according to any one of 1 to 4, wherein the photoluminescent inorganic nanocrystal (B) has been subjected to surface modification with an organic compound having a coordinating functional group.
6. The color conversion member composition according to 5, wherein the coordinating functional group is at least one group selected from an amino group, a thiol group, a phosphoric ester group, a phosphonic acid group, a carboxyl group, a vinyl group, a phosphine group, a phosphine oxide group, and an epoxy group.
7. The color conversion member composition according to any one of 1 to 6, wherein the medium (C) includes a compound having a polymerizable group.
8. The color conversion member composition according to 7, wherein the medium (C) further includes a polymerization initiator.
9. The color conversion member composition according to any one of 1 to 8, wherein the emission spectrum of the photoluminescent inorganic nanocrystal (B) overlaps the transmission spectrum of the color filter material (A) in an amount of 50% or more in area.
10. The color conversion member composition according to any one of 1 to 9, having a viscosity of 1 to 500 mPa·s.
11. A method of producing a color conversion substrate comprising:
applying the composition according to any one of 1 to 10 to a substrate to form a film; and
causing the color filter material (A) and the photoluminescent inorganic nanocrystal (B) to undergo phase separation in the film to form a color filter layer and a color conversion layer.
12. A method of producing a color conversion substrate comprising:
applying the color conversion member composition according to 2 or 3 to a substrate to form a film;

evaporating the good solvent from the film to cause one of the color filter material (A) and the photoluminescent inorganic nanocrystal (B) to be deposited on the top surface of the film to form one of a color filter layer and a color conversion layer; and evaporating the poor solvent to form the other of the color filter layer and the color conversion layer.

13. The method of producing a color conversion substrate according to 12, wherein, after evaporating the good solvent, the poor solvent is evaporated by increasing the temperature of the composition.

14. The method of producing a color conversion substrate according to 12 or 13, comprising curing the composition after evaporating the solvents.

15. The method of producing a color conversion substrate according to any one of 11 to 14, wherein a patterned film is formed using a photolithographic method or a printing method.

16. The method of producing a color conversion substrate according to 15, wherein the printing method is a screen printing method, an inkjet method, or a nozzle jet method.

17. A color conversion substrate produced by the method according to any one of 11 to 16.

According to the invention, a composition can be provided which is capable of easily and efficiently producing a color conversion member including a color filter layer and a color conversion layer which contains a photoluminescent inorganic nanocrystal at a concentration which ensures a sufficient color conversion performance.

According to the invention, a method can be provided which is capable of producing a color conversion substrate with high productivity.

DETAILED DESCRIPTION OF THE PREFERRED EMBODIMENTS

In a composition according to the invention, one of a color filter material and a photoluminescent inorganic nanocrystal exhibits high affinity to a medium (matrix) and/or a solvent, and the other of the color filter material and the photoluminescent inorganic nanocrystal exhibits low affinity to the medium (matrix) and/or the solvent. Therefore, when applying the composition to a substrate to form a film, phase separation is promoted in the film so that the low-affinity material is deposited on the surface of the matrix, whereby a layer is formed of the low-affinity material. Specifically, a two-layer structure can be formed in a single step in which a color filter layer and a photoluminescent inorganic nanocrystal layer are adjacently disposed.

According to one aspect of the invention, a color filter layer and a color conversion layer are formed in a single step by incorporating a color filter material and a color conversion material in a single composition, and causing the color filter material and the color conversion material to undergo phase separation by utilizing the difference in affinity to a medium and/or a solvent between the color filter material and color conversion material in the composition.

In more detail, a color conversion member composition according to the invention comprises (A) a color filter material, (B) a photoluminescent inorganic nanocrystal, (C) a medium, and (D) a solvent, wherein the color filter material (A) and the photoluminescent inorganic nanocrystal (B) differ in affinity to the medium (C) and/or the solvent (D).

The term "affinity" used in the invention is defined by chemical affinity shown by "$A=dQ''/d\xi$ ($Q''$ is uncompensated heat, and $\xi$ is extent of reaction)". In chemical reaction, forward reaction generally proceeds more quickly as chemical affinity becomes higher. The term "affinity" indicates the affinity between reactants in the reaction system.

The chemical affinity A is determined by the maximum work made by a chemical change or a change in free energy.

In the invention, one of the color filter material and the photoluminescent inorganic nanocrystal which exhibits lower chemical affinity to the medium and/or the solvent exhibits lower affinity to the medium and/or the solvent and is bled out toward the surface of the coating film during coating film formation.

Figure 1A:
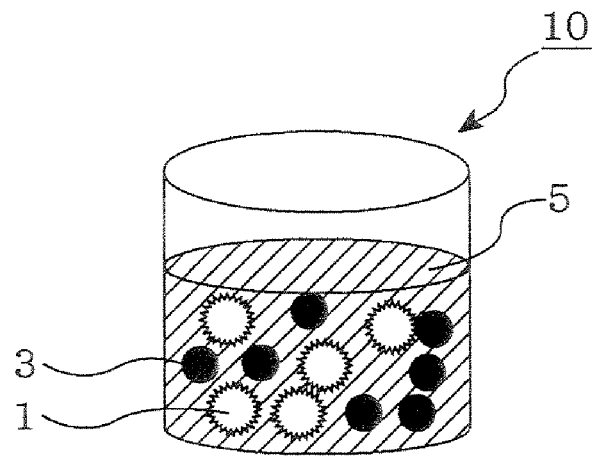
FIG. 1A is a view showing a method of producing a color conversion substrate according to one embodiment of the invention.

The case where the color filter material (A) exhibits affinity higher than that of the photoluminescent inorganic nanocrystal B is described below with reference to FIGS. 1A to 1C.

Figure 1B:
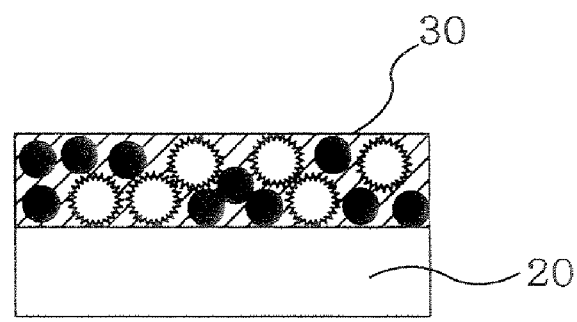
FIG. 1B is another view showing the method of producing a color conversion substrate according to one embodiment of the invention.
Figure 1C:
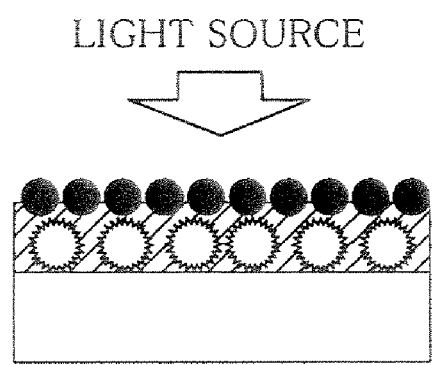
FIG. 1C is yet another view showing the method of producing a color conversion substrate according to one embodiment of the invention.

A composition 10 containing a color filter material 1, a photoluminescent inorganic nanocrystal 3, and a medium/solvent 5 (FIG. 1A) is applied to a glass substrate 20 to form a film 30 (FIG. 1B). The photoluminescent inorganic nanocrystal 3 with low affinity is deposited on the surface of the coating film on standing, whereby a two-layer film structure is formed in which phase separation occurs so that the photoluminescent inorganic nanocrystal 3 forms the upper layer and the color filter material 1 forms the lower layer (FIG. 1C). The medium 5 is then cured by applying light.

Figure 2A:
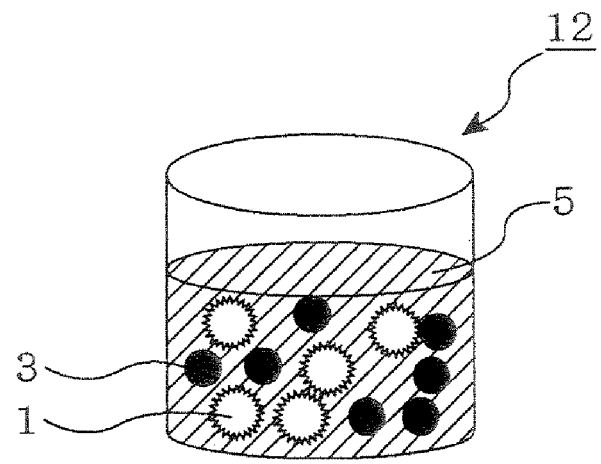
FIG. 2A is a view showing a method of producing a color conversion substrate according to another embodiment of the invention.

The case where the color filter material (A) exhibits affinity lower than that of the photoluminescent inorganic nanocrystal (B) is described below with reference to FIGS. 2A to 2C.

Figure 2B:
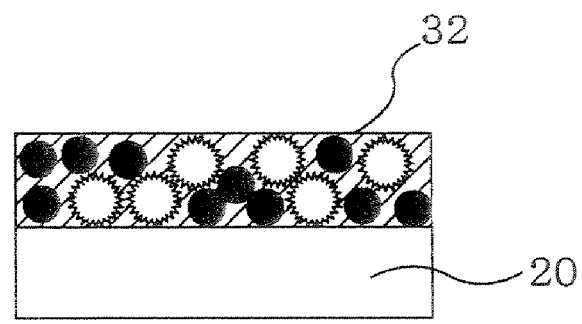
FIG. 2B is another view showing the method of producing a color conversion substrate according to the other embodiment of the invention.
Figure 2C:
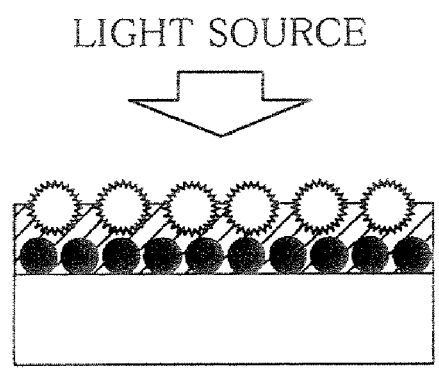
FIG. 2C is yet another view showing the method of producing a color conversion substrate according to the other embodiment of the invention.

A composition 12 containing the color filter material 1, the photoluminescent inorganic nanocrystal 3, and the medium/solvent 5 (FIG. 2A) is applied to the glass substrate 20 to form a film 32 (FIG. 2B). The color filter material 1 with low affinity is deposited on the surface of the coating film on standing, whereby a two-layer film structure is formed in which phase separation occurs so that the color filter material 1 forms the upper layer and the photoluminescent inorganic nanocrystal 3 forms the lower layer (FIG. 2C). The medium 5 is then cured by applying light.

A second aspect of the invention utilizes the difference in vaporization rate between solvents.

In this aspect, a two-layer structure in which a color filter layer and a photoluminescent inorganic nanocrystal layer are adjacently disposed is formed in a single step by causing a color filter material and a photoluminescent inorganic nanocrystal to undergo phase separation by using the difference in solubility between the color filter material and the photoluminescent inorganic nanocrystal in solvents used and using the vapor pressure of each solvent.

In more detail, a color conversion member composition according to the invention comprises (A) a color filter material, (B) a photoluminescent inorganic nanocrystal, (C) a medium, and (D) two or more solvents, wherein all of the solvents (D) are good solvents for one of the color filter material (A) and the photoluminescent inorganic nanocrystal (B), the solvents (D) include a good solvent and a poor solvent for the other of the color filter material (A) and the photoluminescent inorganic nanocrystal (B), and the good solvent has a vapor pressure higher than that of the poor solvent.

When expressing the difference in solubility of a solute between or among two or more solvents, the correlation between the solvents is generally expressed using the terms "good solvent" and "poor solvent". Specifically, the term "good solvent" refers to a solvent in which the solute dissolves well, and the term "poor solvent" refers to a solvent which exhibits poor capability of dissolving the solute in comparison with the good solvent. In the invention, a solvent in which the solute dissolves to a concentration of 1 wt % or more may be referred to as a good solvent, and a solvent in which the solute dissolves to a concentration of less than 1 wt % may be referred to as a poor solvent, for example.

The term "good solvent" used in the invention specifically refers to a solvent that can be with the color filter material (A), the photoluminescent inorganic nanocrystal (B), and the medium (C).

The term "poor solvent" used in the invention refers to a solvent which is mixed with the color filter material (A), the photoluminescent inorganic nanocrystal (B), and the medium (C) to only a small extent and is not the above good solvent.

A vaporization rate generally reflects a vapor pressure. In the case of two different solvents, a solvent with a higher vapor pressure exhibits a higher vaporization rate. In the above composition, the good solvent has a vapor pressure higher than that of the poor solvent. When the good solvent and the poor solvent significantly differ in vaporization rate, that is, when the vapor pressure of the good solvent is too high compared to that of the poor solvent, the good solvent may volatilize before applying the composition to the substrate, whereby phase separation may occur before forming the coating film of the composition.

On the other hand, when the vaporization rate of the good solvent is significantly close to the vaporization rate of the poor solvent, that is, when the vapor pressure of the good solvent is significantly close to that of the poor solvent, the good solvent and the poor solvent may vaporize almost equally, whereby a phase separation structure may not be formed.

Therefore, in order to maintain the mutual solubility of the color filter material and the photoluminescent inorganic nanocrystal in the composition and form a homogeneous phase separation structure, it is preferable to select the solvents such that the ratio of the vapor pressure of the good solvent to the vapor pressure of the poor solvent (relative volatility) is 10 to 1000, and more preferably 50 to 500.

The vapor pressure is expressed by the Antoine equation ($LogP=A-B/(C+t)$; A, B, C: constants specific to each solvent, P: vapor pressure, t: operation temperature). The vapor pressure can be experimentally determined by measuring the vapor pressure at three or more temperature points (see Shuzo Ohe, "Property Constant Estimation Method for Designers", p. 57 to 82, Nikkan Kogyo Shimbun, Ltd. (1985)).

The case where the solvent (D) is a mixture of two or more solvents including (a) a solvent which is a good solvent for the color filter material and the photoluminescent inorganic nanocrystal and (b) a solvent which is a good solvent for the color filter material and is a poor solvent for the photoluminescent inorganic nanocrystal, and the solvent (a) has a vapor pressure higher than that of the solvent (b) is described below with reference to FIGS. 3A to 3D.

Figure 3A:
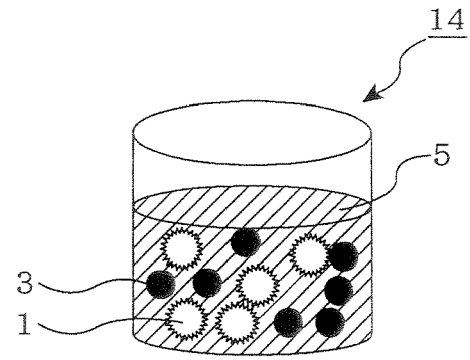
FIG. 3A is a view showing a method of producing a color conversion substrate according to another embodiment of the invention.
Figure 3B:
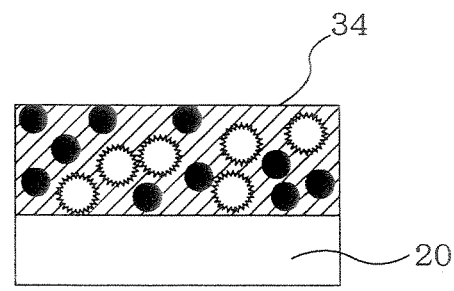
FIG. 3B is another view showing the method of producing a color conversion substrate according to the other embodiment of the invention.
Figure 3C:
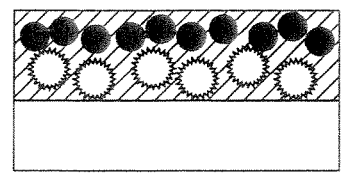
FIG. 3C is another view showing the method of producing a color conversion substrate according to the other embodiment of the invention.
Figure 3D:
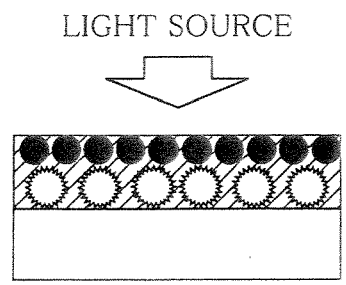
FIG. 3D is yet another view showing the method of producing a color conversion substrate according to the other embodiment of the invention.

A composition 14 containing the color filter material 1, the photoluminescent inorganic nanocrystal 3, and the medium/solvent (mixed solvent of the solvents (a) and (b)) 5 (FIG. 3A) is applied to the glass substrate 20 to form a film 34 (FIG. 3B). When evaporating the solvent by drying, since the good solvent is evaporated faster than the poor solvent, the photoluminescent inorganic nanocrystal is easily deposited on the surface of the coating film due to nonmutual solubility repulsion between the surface of the photoluminescent inorganic nanocrystal and the poor solvent (FIG. 3C). As a result, a phase separation structure is formed in which the photoluminescent inorganic nanocrystal forms the upper layer and the color filter material forms the lower layer (FIG. 3D). The medium 5 is then cured by applying light.

A case where the solvent (D) is a mixture of two or more solvents including (a) a solvent which is a good solvent for the color filter material and the photoluminescent inorganic nanocrystal and (c) a solvent which is a good solvent for the photoluminescent inorganic nanocrystal and is a poor solvent for the color filter material, and the solvent (a) has a vapor pressure higher than that of the solvent (c) is described below with reference to FIGS. 4A to 4D.

Figure 4A:
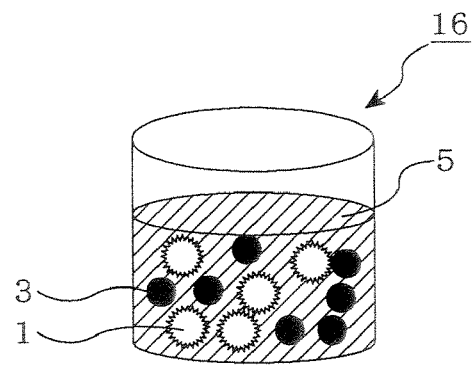
FIG. 4A is a view showing a method of producing a color conversion substrate according to yet another embodiment of the invention.
Figure 4B:
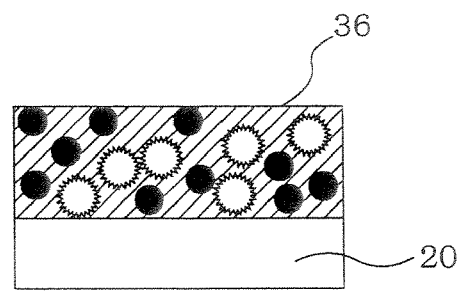
FIG. 4B is another view showing the method of producing a color conversion substrate according to the other embodiment of the invention.
Figure 4C:
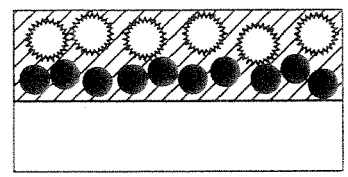
FIG. 4C is another view showing the method of producing a color conversion substrate according to the other embodiment of the invention.
Figure 4D:
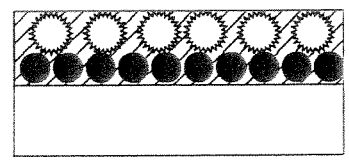
FIG. 4D is yet another view showing the method of producing a color conversion substrate according to the other embodiment of the invention.

A composition 16 containing the color filter material 1, the photoluminescent inorganic nanocrystal 3, and the medium/solvent (mixed solvent of the solvents (a) and (c)) 5 (FIG. 4A) is applied to the glass substrate 20 to form a film 36 (FIG. 4B). When evaporating the solvent by drying, since the good solvent is evaporated faster than the poor solvent, the color filter material is easily deposited on the surface of the coating film due to nonmutual solubility repulsion between the color filter material and the poor solvent (FIG. 4C). As a result, a phase separation structure is formed in which the color filter material forms the upper layer and the photoluminescent inorganic nanocrystal forms the lower layer (FIG. 4D). The medium 5 is then cured by applying light.

When producing a color conversion substrate as described above, the color conversion substrate can be more efficiently produced by changing the temperature profile during drying. For example, after evaporating the good solvent, the poor solvent is evaporated by increasing the temperature.

As examples of the method of applying the composition to the substrate, a photolithographic method, a printing method, and the like can be given.

When applying the composition to the substrate in a pattern, a photolithographic method which has been widely used, or a printing method more suitable for high-resolution processing, such as a screen printing method, an inkjet method, or a nozzle jet method, may be suitably used as the patterning method.

As the substrate used for the color conversion substrate, a generally-used substrate such as a glass substrate or a plastic substrate may be used.

In the above embodiments, the medium is cured by applying light. Note that the curing method is not limited thereto. For example, the medium may be cured by applying laser light, heating, or the like. The curing step is unnecessary when using a thermoplastic resin as the medium.

As described above, since the color conversion layer and the color filter layer can be formed at one time in a single application step by using the composition according to the invention, a color conversion member can be easily, inexpensively, and efficiently produced. Moreover, since the composition according to the invention can be used as an inkjet ink, a color conversion member can be produced with high productivity.

The color filter material (A) used for the color conversion member is described below. The color filter material is not particularly limited. For example, the color filter material includes a dye or a pigment. As examples of the color filter material, the following dyes can be given.

Red (R) Dye:

A perylene pigment, a lake pigment, an azo pigment, a quinacridon pigment, an anthraquinone pigment, an anthracene pigment, an isoindoline pigment, an isoindolinone pigment, or a mixture of at least two of these pigments may be used.

Green (G) Dye:

A halogen-multisubstituted phthalocyanine pigment, a halogen-multisubstituted copper phthalocyanine pigment, a triphenylmethane basic dye, an isoindoline pigment, an isoindolinone pigment, or a mixture of at least two of these pigments may be used.

Blue (B) Dye:

A copper phthalocyanine pigment, an indanthrone pigment, an indophenol pigment, a cyanine pigment, a dioxazine pigment, or a mixture of at least two of these pigments may be used.

A commercially-available color filter resist may be used as the color filter material. The content of solids such as a resin and a pigment in the color filter resist is preferably 10 to 40 wt %, and more preferably 20 to 25 wt %. The content of the pigment in the solids is preferably 10 to 60 wt %, and more preferably 20 to 40 wt %.

It is preferable that the primary particle diameter of the color filter material be small in order to suppress scattered light. The primary particle diameter of the color filter material is 1 nm to 1 µm, and preferably 1 to 100 nm, for example.

The thickness of the color filter layer may be the same as that of the color conversion layer. It is preferable to reduce the thickness of the color filter layer in order to achieve a uniform color display. The thickness of the color filter layer is 10 nm to 5 µm, and preferably 100 nm to 3 µm, for example.

As examples of the photoluminescent inorganic nanocrystal (B), the following materials can be given.

(1) Semiconductor Nanocrystal

Group II-IV compound semiconductor nanocrystals such as ZnSe, ZnTe, and CdSe, Group III-V compound semiconductor nanocrystals such as InP, and chalcopyrite semiconductor nanocrystals such as $CuInS_2$ and $CuInSe_2$.

The semiconductor nanocrystal is produced by reducing the diameter of a semiconductor crystal to the order of nanometers. The particle diameter of the semiconductor nanocrystal is preferably 20 nm or less, and more preferably 10 nm or less.

(2) Nanocrystal Obtained by Doping Metal Chalcogenide with Transition Metal Ion

Nanocrystal obtained by doping a metal chalcogenide such as ZnS, ZnSe, CdS, or CdSe with a transition metal ion such as $Eu^{2+}$, $Eu^{3+}$, $Ce^{3+}$, $Tb^{3+}$, or $Cu^{2+}$.

(3) Nanocrystal Obtained by Doping Metal Oxide with Transition Metal Ion

Nanocrystal obtained by doping a metal oxide such as $Y_2O_3$, $Gd_2O_3$, ZnO, $Y_3Al_5O_{12}$, or $Zn_2SiO_4$ with a transition metal ion which absorbs visible light, such as $Eu^{2+}$, $Eu^{3+}$, $Ce^{3+}$, or $Tb^{3+}$.

The nanocrystals mentioned in (1) and (2) may be subjected to surface modification with a metal oxide such as silica or an organic substance such as a long-chain alkyl group or phosphoric acid in order to prevent oxidation of the surface of the nanocrystal or removal of S, Se, or the like.

A nanoparticle produced by covering the surface of the above nanoparticle with another semiconductor called a shell is more preferable in view of stability and photoluminescence. The surface of the shell may be further covered with a metal oxide such as silica or titania.

The above photoluminescent inorganic nanocrystals may be used either individually or in combination of two or more.

The photoluminescent inorganic nanocrystal may be subjected to surface modification with an organic compound having various coordinating functional groups (coordinating compound) in order to control dispersibility and the like. The affinity to the medium or the solvent or the solubility of the photoluminescent inorganic nanocrystal can be adjusted by such surface modification. Specifically, the type or the amount used of the medium and/or the solvent and the like can be adjusted by changing the type of coordinating compound used for surface modification.

As examples of the coordinating functional group effective for surface modification, an amino group, a thiol group, a phosphoric ester group, a carboxyl group, a phosphonic acid group, a phosphine group, a phosphine oxide group, a vinyl group, an epoxy group, and the like can be given.

As specific examples of the compound containing an amino group, ethylenediamine, octylamine, decylamine, pyridine, amino-terminated polyethylene glycol (PEG), tetramethylethylenediamine, and glycine tert-butyl ester can be given.

As specific examples of the compound containing a thiol group, ethanethiol, ethanedithiol, t-butylthiol, hexanethiol, octanethiol, benzenethiol, triphenylmethylmercaptan, octyl thioglycolate, 2-ethylhexyl-3-mercaptopropionate, thiol-terminated PEG, 3-mercaptopropyltrimethoxysilane, 3-mercaptopropyl(dimethoxy)methylsilane, and thioglycolic acid methoxytri(oxyethylene) can be given.

As specific examples of the compound containing a phosphoric ester group, dibutyl phosphate, di-n-decyl phosphate, di(polyethylene glycol 4-nonylphenyl) phosphate, and tributyl phosphate can be given.

As specific examples of the compound containing a carboxyl group, decanoic acid, 2-ethylhexanoic acid, 4-hexylbenzoic acid, and 4-vinylbenzoic acid can be given.

As specific examples of the compound containing a phosphonic acid group, octylphosphonic acid, tetradecanephosphonic acid, and diethylbenzylphosphonic acid can be given.

As specific examples of the compound containing a phosphine group, tributylphosphine and trioctylphosphine can be given.

As specific examples of the compound containing a phosphine oxide group, tributylphosphine oxide and trioctylphosphine oxide can be given.

As specific examples of the compound containing a vinyl group, dodecene, methyl undecenoate, vinyl undecenoate, and 1,2-epoxy-9-decene can be given.

As specific examples of the compound containing an epoxy group, 1,2-epoxy-dodecane, 1,2-epoxy-9-decene, styrene oxide, α-pinene oxide, and 3-glycidyloxytrimethoxysilane can be given.

As the combination of the color filter material (A) and the photoluminescent inorganic nanocrystal (B), it is preferable that the light transmitting region of the color filter material coincide with the emitting region of the photoluminescent inorganic nanocrystal, and that the non-light transmitting region of the color filter material coincide with the non-emitting region of the photoluminescent inorganic nanocrystal.

In order to obtain a highly efficient color conversion layer using the photoluminescent inorganic nanocrystal, it is preferable that the emission peak wavelength of the nanocrystal is present within the region in which the color filter material exhibits the highest transmittance. Specifically, it is preferable that the transmitting range of the color filter material overlaps the emission spectrum in an amount of at least 50%.

It is preferable that the medium (C) transmit light and have a transmittance in the visible region of preferably 50% or more. The medium (C) is formed of a mixture of a matrix resin, an optional compound having a polymerizable group (crosslinkable monomer), and an optional polymerization initiator.

It is more preferable that the medium contain a thermosetting resin from the viewpoint of maintaining the performance of the resulting substrate and ensuring gas barrier properties.

As examples of the matrix resin, the following resins can be given.

(1) Thermoplastic resins such as polyamide, polyester, polyetherimide, polyethersulfone, polyvinyl chloride, polycarbonate, polyvinyl butyral, polyphenylene ether, (meth) acrylic resin, and cyclic olefin resin
(2) Thermosetting resins such as acrylic resin, imide resin, urea resin, urethane (type) resin, epoxy resin, vinyl ester resin, phenol resin, and melamine resin
(3) Mixture of these resins The compound having a polymerizable group is not limited insofar as the resulting cured product transmits light. As the compound having a polymerizable group, a polyfunctional (meth)acrylate compound, a polyfunctional epoxy compound, a di(tri)alkoxysilane, and the like are preferable.

The polymerization initiator may be either a photoinitiator or a thermal initiator.

It is preferable that the medium contain the compound having a polymerizable group and the polymerization initiator from the viewpoint of sealing properties after forming the substrate, the film strength, and the like. It is preferable that the compound having a polymerizable group be a polyfunctional compound.

The solvent (D) is used to adjust the viscosity of the composition to a value optimum for the substrate production process. It is preferable to select the solvent (D) taking effects on the film strength and productivity into consideration.

For example, the solvent (D) may be selected from xylene, toluene, hexane, diethylene glycol dimethyl ether, propylene glycol monoethyl acetate, propylene glycol monomethyl ether acetate, cyclohexanone, chloroform, and the like.

The composition according to the invention preferably contains the components (A) to (D) in amounts given below.
(A) Color filter material: 1 to 10 wt %, and more preferably 5 to 10 wt %
(B) Photoluminescent inorganic nanocrystal: 1 to 10 wt %, and more preferably 5 to 10 wt %
(C) Medium: 10 to 50 wt %, and more preferably 20 to 40 wt %
(D) Solvent: 30 to 80 wt %, and more preferably 50 to 70 wt %

If the amount of the color filter material (A) added is too small, contrast may not be sufficiently improved.

If the amount of the photoluminescent inorganic nanocrystal (B) added is too small, color conversion efficiency may be decreased.

If the amount of the medium (C) added is too small, the strength of the resulting coating film may not be sufficiently maintained. If the amount of the medium (C) added is too large, problems such as a decrease in color conversion efficiency or a decrease in productivity due to a decrease in flowability may occur.

If the amount of the solvent (D) added is too small, since the flowability of the composition may become insufficient when applying the composition to the substrate, the photoluminescent inorganic nanoparticles and the color filter material may not promptly and homogeneously undergo phase separation, whereby a color conversion substrate may not be produced with high efficiency.

The viscosity of the composition is usually 1 to 500 mPa·s. When using a nozzle printing method as the coating method, the end of the nozzle may be clogged when the composition solution has a high viscosity. Therefore, the viscosity of the composition is preferably 1 to 10 mPa·s. On the other hand, since the composition solution is applied by spin coating or the like when using a photolithographic method, it is preferable that the composition solution have a viscosity of about 100 to 300 mPa·s.

EXAMPLES

Synthesis Example 1

[Synthesis of InP/ZnS Nanocrystal]
An InP/ZnS nanocrystal was synthesized with reference to J. Am. Chem. Soc., 2005, 127, 11364. A summary of the synthesis operation is given below.

(1) Synthesis of InP Core
A 200 ml four-necked flask was charged with 0.29 g of indium acetate, 0.69 g of myristic acid, and 40 ml of octadecene, and placed in a mantle heater. A mechanical stirrer equipped with a glass stirring axis and Teflon® stirring blades was secured to the main tube of the flask. A three-way stopcock was secured to one of the branch tubes, and connected with a nitrogen line and a vacuum line. A rubber septum cap was secured to another branch tube. A thermocouple was secured to the remaining branch tube.

After evacuating the flask, the mixture was stirred at 120° C. for two hours. After increasing the pressure inside the flask to atmospheric pressure using nitrogen gas, the temperature was increased to 280° C.

In a glove box of which the atmosphere was replaced with nitrogen, 1.4 g of a 10% hexane solution of tristrimethylsilylphosphine and 1 ml of octadecene were weighed in a sample bottle, and the mixture was sucked into a gas-tight syringe.

The solution of the phosphine compound was injected into the four-necked flask at one time through the septum cap. After five seconds, 40 ml of octadecene was added, and the reaction temperature was quickly decreased to 180° C. The mixture was stirred at 180° C. for two hours.

After decreasing the temperature to 50° C., the pressure inside the flask was reduced for one hour using a vacuum pump.

The pressure inside the flask was then increased to atmospheric pressure using nitrogen gas. After reducing the temperature to room temperature, the reaction solution was subjected to centrifugation (3000 rpm, 10 minutes) to remove precipitates. The supernatant liquid was temporarily stored in the glove box.

(2) Synthesis of InP/ZnS Core/Shell Nanocrystal

A 200 ml four-necked flask was charged with 1.48 g of zinc laurate, 0.11 g of sulfur, and 10 ml of octadecene. The flask was provided with the same instruments as used in (1).

After evacuating the flask, the mixture was stirred at 80° C. for 30 minutes. After increasing the pressure inside the flask to atmospheric pressure using nitrogen gas, the solution of the InP nanoparticle stored in the glove box was added to the mixture. The mixture was then stirred at 80° C. for 1.5 hours under reduced pressure.

After increasing the pressure inside the flask to atmospheric pressure using nitrogen gas, the temperature was increased to 140° C., and the mixture was stirred for 1.5 hours.

After decreasing the temperature to room temperature, the reaction solution was subjected to centrifugation (3000 rpm, 15 minutes) to remove large particles and unreacted raw materials.

The resulting nanocrystal had a fluorescence peak wavelength of 634 nm and a fluorescence quantum efficiency of 17%. They were measured using a quantum efficiency measurement instrument (C9920-02) manufactured by Hamamatsu Photonics K.K.

Synthesis Example 2

[Synthesis of Cu-doped ZnSe Nanocrystal]

A Cu-doped ZnSe nanocrystal was synthesized with reference to J. Am. Chem. Soc., 2005, 127, 17586. A summary of the synthesis operation is given below.

A 200 ml four-necked flask was charged with 0.20 g of zinc laurate and 50 ml of octadecene, and provided with the same instruments as used in Synthesis Example 1.

After evacuating the flask, the mixture was stirred at 120° C. for two hours. After increasing the pressure inside the flask to atmospheric pressure using nitrogen gas, the temperature was increased to 300° C.

In a glove box of which the atmosphere was replaced with nitrogen, 0.02 g of selenium, 0.5 g of hexadecylamine, and 7 g of tributylphosphine were weighed in a sample bottle to dissolve the selenium.

The resulting selenium solution was injected into the four-necked flask at one time through the septum cap. The mixture was stirred at 290° C. for 1.5 hours.

In a glove box of which the atmosphere was replaced with nitrogen, 0.031 g of copper acetate and 10 ml of tributylphosphine were weighed in a sample bottle to dissolve the copper acetate. 0.1 ml of the resulting solution was sucked into a syringe and injected into the reaction solution.

After 10 minutes, a solution containing 0.1 g of zinc acetate and 5 ml of tributylphosphine was added dropwise to the reaction solution. The dropwise addition was completed after 30 minutes.

After the dropwise addition, the reaction temperature was increased to 230° C., and the mixture was stirred for 1.5 hours.

After decreasing the temperature to room temperature, the reaction solution was subjected to centrifugation (3000 rpm, 10 minutes) to remove precipitates. The supernatant liquid was temporarily stored in the glove box.

The resulting nanocrystal had a fluorescence peak wavelength of 528 nm and a fluorescence quantum efficiency of 13%.

Example 1

The octadecene solution of the InP/ZnS nanocrystal obtained in Synthesis Example 1 was poured into ethanol to reprecipitate the nanocrystal. After removing the solvent by decantation, the resulting product was vacuum-dried to obtain a nanocrystal (component B) (135 mg). The resulting nanocrystal (component B) was dispersed in 1.0 g of chloroform (component D).

The nanocrystal solution was added to 2.0 g of a led color filter material (CRY-S840B manufactured by FUJIFILM Arch Co., Ltd., solvent: propylene glycol monoethyl acetate (PGMEA)) (component A, component C, and component D) and dispersed using ultrasonic waves to obtain an ink composition.

A glass substrate was prepared in which black matrixes (V259BK manufactured by Nippon Steel Chemical Co., Ltd.) with a width of 20 µm and a thickness of 1.5 µm were formed at intervals of 90 µm using a photolithographic method and partition walls (VPA100/P54-2 manufactured by Nippon Steel Chemical Co., Ltd.) with a width of 15 µm and a height of 10 µm were formed on the black matrixes.

The ink composition was applied to the glass substrate in the area partitioned by the partition walls, and the solvents were slowly evaporated at room temperature. The nanocrystals were concentrated on the top surface of the coating film to form a color conversion layer, and a color filter was formed under the color conversion layer. After the solvents were completely evaporated, the ink composition was cured by applying ultraviolet rays with a wavelength of 365 nm at a dose of 300 mJ to obtain a color conversion substrate with a thickness of 3 µm.

A blue organic EL device was stacked on and adhered to the top surface (coating film side) of the resulting color conversion substrate and was caused to emit light. The blue light from the organic EL device was converted into red light with a peak wavelength of 656 nm. On the other hand, when the blue organic EL device was stacked on and adhered to the other side of the color conversion substrate and was caused to emit light, converted light was not observed.

Chloroform is a good solvent for the nanocrystal and the color filter material. The vapor pressure of chloroform at 20° C. was 21 kPa. PGMEA is a good solvent for the color filter material and is a poor solvent for the nanocrystal. The vapor pressure of PGMEA at 20° C. was 0.5 kPa. Accordingly, the relative volatility of chloroform with respect to PGMEA at 20° C. was 42.

Example 2

The octadecene solution of the Cu-doped ZnSe nanoparticle obtained in Synthesis Example 2 was poured into ethanol to reprecipitate the nanoparticle. After removing the solvent by decantation, the resulting product was vacuum-dried to obtain a Cu-doped ZnSe nanocrystal (component B) (105 mg). The resulting nanocrystal was dispersed in 1.0 g of chloroform (component D).

The nanocrystal solution was added to 2.0 g of a green color filter material (CG-8510L manufactured by FUJIFILM Arch Co., Ltd., solvent: propylene glycol monoethyl acetate (PGMEA)) (component A, component C, and component D) and dispersed using ultrasonic waves.

A color conversion substrate was produced in the same manner as in Example 1. The nanocrystals were concentrated on the top surface of the coating film to form a color conversion layer, and a color filter was formed under the color conversion layer.

A blue organic EL device was stacked on and adhered to the top surface (coating film side) of the resulting color conversion substrate and was caused to emit light. The blue light from the organic EL device was converted into green light with a peak wavelength of 546 nm.

On the other hand, when the blue organic EL device was stacked on and adhered to the other side of the color conversion substrate and was caused to emit light, converted light was not observed.

Chloroform is a good solvent for the nanocrystal and the color filter material. The vapor pressure of chloroform at 20° C. was 21 kPa. PGMEA is a good solvent for the color filter material and is a poor solvent for the nanocrystal. The vapor pressure of PGMEA at 20° C. was 0.5 kPa. Accordingly, the relative volatility of chloroform with respect to PGMEA at 20° C. was 42.

INDUSTRIAL APPLICABILITY

The color conversion substrate according to the invention may be used for emitting devices such as an organic EL device.

What is claimed is:

1. A color conversion member composition comprising (A) a color filter material, (B) a photoluminescent inorganic nanocrystal, (C) a medium, and (D) a solvent, the color filter material (A) and the photoluminescent inorganic nanocrystal (B) differing in affinity to the medium (C) and/or the solvent (D).

2. The color conversion member composition according to claim 1, which contains the color filter material (A) in an amount of 1 to 10 wt %, the photoluminescent inorganic nanocrystal (B) in an amount of 1 to 10 wt %, the medium (C) in an amount of 10 to 50 wt %, and the solvent (D) in an amount of 30 to 80 wt %.

3. The color conversion member composition according to claim 1, wherein the photoluminescent inorganic nanocrystal (B) is surface-modificated with an organic compound having a coordinating functional group.

4. The color conversion member composition according to claim 3, wherein the coordinating functional group is at least one group selected from an amino group, a thiol group, a phosphoric ester group, a phosphonic acid group, a carboxyl group, a vinyl group, a phosphine group, a phosphine oxide group, and an epoxy group.

5. The color conversion member composition according to claim 1, wherein the medium (C) comprises a compound having a polymerizable group.

6. The color conversion member composition according to claim 5, wherein the medium (C) further comprises a polymerization initiator.

7. The color conversion member composition according to claim 1, wherein the emission spectrum of the photoluminescent inorganic nanocrystal (B) overlaps the transmission spectrum of the color filter material (A) in an amount of 50% or more in area.

8. The color conversion member composition according to claim 1, having a viscosity of 1 to 500 mPa·s.

9. A method of producing a color conversion substrate comprising:
applying the composition according to claim 1 to a substrate to form a film; and
causing the color filter material (A) and the photoluminescent inorganic nanocrystal (B) to undergo phase separation in the film to form a color filter layer and a color conversion layer.

10. The method of producing a color conversion substrate according to claim 9, wherein a patterned film is formed using a photolithographic method or a printing method.

11. The method of producing a color conversion substrate according to claim 10, wherein the printing method is a screen printing method, an inkjet method, or a nozzle jet method.

12. A color conversion member composition comprising (A) a color filter material, (B) a photoluminescent inorganic nanocrystal, (C) a medium, and (D) two or more solvents, all of the solvents (D) being good solvents for one of the color filter material (A) and the photoluminescent inorganic nanocrystal (B), the solvents (D) including a good solvent and a poor solvent for the other of the color filter material (A) and the photoluminescent inorganic nanocrystal (B), and the good solvent having a vapor pressure higher than that of the poor solvent.

13. The color conversion member composition according to claim 12, wherein the relative volatility of the good solvent with respect to the poor solvent is 10 to 1000.

14. The color conversion member composition according to claim 12, which contains the color filter material (A) in an amount of 1 to 10 wt %, the photoluminescent inorganic nanocrystal (B) in an amount of 1 to 10 wt %, the medium (C) in an amount of 10 to 50 wt %, and the solvent (D) in an amount of 30 to 80 wt %.

15. The color conversion member composition according to claim 12, having a viscosity of 1 to 500 mPa·s.

16. A method of producing a color conversion substrate comprising:
applying the composition according to claim 12 to a substrate to form a film; and
causing the color filter material (A) and the photoluminescent inorganic nanocrystal (B) to undergo phase separation in the film to form a color filter layer and a color conversion layer.

17. A method of producing a color conversion substrate comprising:

applying the color conversion member composition according to claim 12 to a substrate to form a film;

evaporating the good solvent from the film to cause one of the color filter material (A) and the photoluminescent inorganic nanocrystal (B) to be deposited on the top surface of the film to form one of a color filter layer and a color conversion layer; and evaporating the poor solvent to form the other of the color filter layer and the color conversion layer.

18. The method of producing a color conversion substrate according to claim 17, wherein, after evaporating the good solvent, the poor solvent is evaporated by increasing the temperature.

19. The method of producing a color conversion substrate according to claim 17, comprising curing the composition after evaporating the solvents.

* * * * *